(12) United States Patent
Li et al.

(10) Patent No.: US 11,686,598 B2
(45) Date of Patent: Jun. 27, 2023

(54) DETECTION CIRCUIT OF BRIDGE SENSOR, CHIP AND DETECTION SYSTEM

(71) Applicant: Shenzhen Goodix Technology Co., Ltd., Shenzhen (CN)

(72) Inventors: Guopao Li, Shenzhen (CN); Hong Jiang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 226 days.

(21) Appl. No.: 17/060,015

(22) Filed: Sep. 30, 2020

(65) Prior Publication Data

US 2021/0041266 A1 Feb. 11, 2021

Related U.S. Application Data

(63) Continuation of application No. PCT/CN2019/099316, filed on Aug. 5, 2019.

(51) Int. Cl.
*G01D 5/16* (2006.01)
*H03F 3/45* (2006.01)

(52) U.S. Cl.
CPC ............ *G01D 5/16* (2013.01); *H03F 3/45475* (2013.01); *H03F 2200/129* (2013.01); *H03F 2203/45116* (2013.01)

(58) Field of Classification Search
CPC . G01D 5/16; H03F 3/45475; H03F 2200/129; H03F 2203/45116;

(Continued)

(56) References Cited

U.S. PATENT DOCUMENTS 6,366,099 B1 4/2002 Reddi
2004/0020301 A1 2/2004 Borenstein
(Continued)

FOREIGN PATENT DOCUMENTS

CN 1089352 A 7/1994
CN 1987363 A 6/2007
(Continued)

OTHER PUBLICATIONS

Shenzhen Goodix Technology Co., Ltd., CN First Office Action, CN201980004034,9, dated Apr. 26, 2021, 10 pgs.
(Continued)

*Primary Examiner* — Tarun Sinha
*Assistant Examiner* — James I Burris
(74) *Attorney, Agent, or Firm* — USCH Law, PC (57) ABSTRACT

Provided are a detection circuit of a bridge sensor, a chip and a detection system. The detection circuit includes: an alternating current excitation module, and further includes a signal conditioning module, an analog-to-digital conversion module and a processing module connected in sequence. The alternating current excitation module is configured to apply an alternating current excitation signal to the bridge sensor. The signal conditioning module and the analog-to-digital conversion module are configured to sequentially process an output signal of the bridge sensor. The processing module is configured to demodulate the processed output signal and obtain detection information of the bridge sensor according to the demodulated output signal. In embodiments of the present disclosure, a white noise of the system can be greatly suppressed, and a signal-to-noise ratio of the system is improved, thereby improving detection performance of the bridge sensor.

16 Claims, 4 Drawing Sheets

(58) Field of Classification Search
CPC ......... H03F 2200/261; H03F 2200/321; H03F 2203/45138; H03F 2203/45528; H03K 17/945; H03K 2217/94031; G01R 17/10; G05B 19/0428; G05B 2219/2612
See application file for complete search history.

(56) References Cited

U.S. PATENT DOCUMENTS

| | | | |
|---|---|---|---|
| 2009/0140900 A1* | 6/2009 | Pun | H03M 3/34 330/7 |
| 2010/0213933 A1 | 8/2010 | Mather et al. | |
| 2015/0309083 A1* | 10/2015 | Matzen | G01L 9/06 73/862.628 |
| 2017/0356813 A1 | 12/2017 | Smerzi | |

FOREIGN PATENT DOCUMENTS

| | | | | |
|---|---|---|---|---|
| CN | 101732044 A | 6/2010 | | |
| CN | 101819234 A | 9/2010 | | |
| CN | 101865883 A | 10/2010 | | |
| CN | 101975893 A | 2/2011 | | |
| CN | 102077467 A | 5/2011 | | |
| CN | 102175921 A | * 9/2011 | | |
| CN | 102175921 A | 9/2011 | | |
| CN | 102435238 A | 5/2012 | | |
| CN | 102636188 A | 8/2012 | | |
| CN | 102636236 A | 8/2012 | | |
| CN | 102694510 A | 9/2012 | | |
| CN | 202648692 U | 1/2013 | | |
| CN | 103245372 A | 8/2013 | | |
| CN | 203224209 U | 10/2013 | | |
| CN | 104808064 A | 7/2015 | | |
| CN | 104870960 A | 8/2015 | | |
| CN | 104991115 A | 10/2015 | | |
| CN | 206488794 U | 9/2017 | | |
| CN | 206523244 U | 9/2017 | | |
| CN | 104991115 B | * 12/2017 | | |
| CN | 107907269 A | 4/2018 | | |
| CN | 108592775 A | 9/2018 | | |
| CN | 108627146 A | 10/2018 | | |
| CN | 108801298 A | 11/2018 | | |
| CN | 208621082 U | 3/2019 | | |
| CN | 110057477 A | * 7/2019 | ........... G01L 1/2262 | |
| CN | 110057477 A | 7/2019 | | |
| DE | 102017129461 B3 | 5/2019 | | |
| JP | 2005241433 A | 9/2005 | | |
| WO | 2014094777 A1 | 6/2014 | | |

OTHER PUBLICATIONS

Shenzhen Goodix Technology Co., Ltd., International Search Report, PCT/CN2019/099316, dated May 8, 2020, 8 pgs.
Shenzhen Goodix Technology Co.,Ltd., CN Notice to Grant with English Translation, CN 201980004034.9, dated Jan. 29, 2022, 7 pgs.
Shenzhen Goodix Technology Co.,Ltd., Extended European Search Report, EP 19920638.4, dated Apr. 25, 2022, 7 pgs.

* cited by examiner

DETECTION CIRCUIT OF BRIDGE SENSOR, CHIP AND DETECTION SYSTEM

CROSS REFERENCE TO RELATED APPLICATIONS

The present application is a continuation application of PCT Application No. PCT/CN2019/099316, filed Aug. 5, 2019, which is incorporated herein by reference in its entirety.

TECHNICAL FIELD

The present disclosure relates to the field of detection technology, in particular to a detection circuit of a bridge sensor, a chip and a detection system.

BACKGROUND

Bridge sensors are often used as sensing elements of pressure and temperature sensors and the like, and are widely applied to machinery, automobiles and other vehicles, electricity, motors, civil engineering, medicine, food and other fields. Due to their good linearity and thinness, they have been widely used in the field of human-computer interactions in recent years, such as touch screen pressure detection, electronic product button pressure detection, optical fingerprint pressure detection, smart watch pressure detection and the like.

For example, when a resistance strain gauge is used to form a bridge sensor for pressure detection, the bridge sensor may be installed on a specific surface of an elastic element. When the elastic element is strained, a resistance value of the resistance strain gauge may change slightly, which is output in the form of an electrical signal after being processed by a bridge circuit. This is the working principle of a bridge pressure sensor. In a detection circuit of a traditional bridge sensor, a direct current voltage source or a direct current source is applied to a bridge, and a voltage signal output from the bridge is processed by a processing circuit to obtain pressure data or temperature data.

SUMMARY

Some embodiments of the present disclosure provide a detection circuit of a bridge sensor, a chip and a detection system, which can greatly suppress a white noise of the system and improve a signal-to-noise ratio of the system, thereby improving detection performance of the bridge sensor.

An embodiment of the present disclosure provides a detection circuit of a bridge sensor, including an alternating current excitation module, and further including a signal conditioning module, an analog-to-digital conversion module and a processing module which are connected in sequence. The alternating current excitation module is configured to apply an alternating current excitation signal to the bridge sensor. The signal conditioning module and the analog-to-digital conversion module are configured to sequentially process an output signal from the bridge sensor. The processing module is configured to demodulate a processed output signal and obtain detection information of the bridge sensor according to a demodulated output signal.

An embodiment of the present disclosure further provides a chip, which includes the above-described detection circuit of the bridge sensor.

An embodiment of the present disclosure further provides a detection system, which includes a bridge sensor and the above-described detection circuit of the bridge sensor.

Compared with the existing technology, in an embodiment of the present disclosure, an alternating current excitation signal is applied to the bridge sensor. Due to a narrow bandwidth of the signal extracted from the demodulation of the alternating current signal, a white noise of the system can be greatly suppressed, and a signal-to-noise ratio of the system can be improved, thereby improving a detection sensitivity of the bridge sensor. In addition, the demodulation of the alternating current signal supports a frequency hopping, which can avoid an interference frequency band of an external strong noise and greatly improve the reliability of the system in a harsh environment.

For example, the processing module processes the demodulated output signal based on a correlated double sampling technique to obtain the detection information of the bridge sensor. In this embodiment, the output signal is processed based on the correlated double sampling technique, which may eliminate an output signal offset caused by a low frequency noise in the bridge sensor and the detection circuit as much as possible, thereby improving the signal-to-noise ratio.

For example, the alternating current excitation module includes a first direct current voltage source, a second direct current voltage source and a first switch configured to switch and connect the first direct current voltage source or the second direct current voltage source to a first excitation applying terminal of the bridge sensor. The processing module is configured to control the first switch to execute a switching operation. A voltage output from the first direct current voltage source is different from a voltage output from the second direct current voltage source. In this embodiment, the alternating current excitation module is a hardware circuit, and the alternating current excitation signal is generated through the hardware circuit.

For example, the alternating current excitation module further includes a second switch configured to switch the first direct current voltage source or the second direct current voltage source to a second excitation applying terminal of the bridge sensor. The processing module is configured to control the second switch to execute a switching operation. In a first state, the processing module controls the first direct current voltage source to connect to the first excitation applying terminal through the first switch, and controls the second direct current voltage source to connect to the second excitation applying terminal through the second switch. In a second state, the processing module controls the second direct current voltage source to connect to the first excitation applying terminal through the first switch, and controls the first direct current voltage source to connect to the second excitation applying terminal through the second switch. This embodiment provides a specific example of a hardware implementation for the alternating current excitation module, which may suppress a power supply noise by switching the input voltage to two excitation applying terminals of the bridge sensor at the same time.

For example, a voltage output from the first direct current voltage source and a voltage output from the second direct current voltage source are equal in magnitude and opposite in direction. In this embodiment, two direct current voltage sources, configured to form the alternating current excitation signal in a switch connection manner, output voltages of the same magnitude and opposite directions, which may maximize a valid voltage signal amount of the alternating current excitation signal.

For example, the signal conditioning module includes an instrumentation amplifier and an anti-alias filter. A first input terminal of the instrumentation amplifier is connected to an output terminal of the bridge sensor, an output terminal of the instrumentation amplifier is connected to an input terminal of the anti-alias filter, and an output terminal of the anti-alias filter is connected to an input terminal of the analog-to-digital conversion module. The signal conditioning module further includes a cancellation circuit. The cancellation circuit is connected to a second input terminal of the instrumentation amplifier, and the cancellation circuit is configured such that a magnitude of a voltage output from the instrumentation amplifier meets a preset requirement in the case when no external force acts on the bridge sensor. In this embodiment, the signal conditioning module is newly added with the cancellation circuit, which may cancel a signal offset caused by incomplete matching of each bridge arm in the bridge sensor as much as possible. Therefore, a requirement for matching degree of bridge arms in the bridge sensor may be reduced, and high-quality detection can be realized for an existing bridge sensor.

For example, the instrumentation amplifier has two second input terminals. The cancellation circuit includes a first direct current source, a second direct current source, a third switch configured to switch the first direct current source or the second direct current source to one of the second input terminals, and a fourth switch configured to switch the first direct current source or the second direct current source to the other one of the second input terminals. The processing module is configured to control the third switch and the fourth switch to execute a switching operation. A current output from the first direct current source and a current output from the second direct current source are equal in magnitude and opposite in direction. This embodiment provides a specific implementation of the cancellation circuit.

For example, the processing module is configured to demodulate the processed output signal based on a quadrature demodulation method. In this embodiment, the quadrature demodulation method is adopted, and a calculation amount is small.

BRIEF DESCRIPTION OF THE DRAWINGS

One or more embodiments are described as examples with reference to the corresponding figures in the accompanying drawings, and the examples do not constitute a limitation on the embodiments. Elements with the same reference numerals in the accompanying drawings represent similar elements. The figures in the accompanying drawings do not constitute a proportion limitation unless otherwise stated.

DETAILED DESCRIPTION

In order to make objectives, technical solutions and advantages of the present disclosure clearer, some embodiments of the present disclosure will be explained below in detail with reference to accompanying drawings and embodiments. It should be understood that specific embodiments described here only explain the disclosure but do not constitute a limitation on the disclosure. The following embodiments are divided for convenience of description, and should not constitute any limitation on the specific implementation of the present disclosure. The various embodiments may be combined with each other and referred to each other on the premise of no contradiction.

The inventor found that there are at least the following problems in the existing technology. In consumer electronic products, lightness and thinness are highlight of the products. However, for light and thin products, a structural design space is limited, a strain is extremely small, a resistance value of a bridge changes little, and a voltage signal output from a bridge is also small. In this way, processing a noise of a circuit may have a great impact on the voltage signal, which ultimately leads to a low detection accuracy of a bridge sensor.

Figure 1:
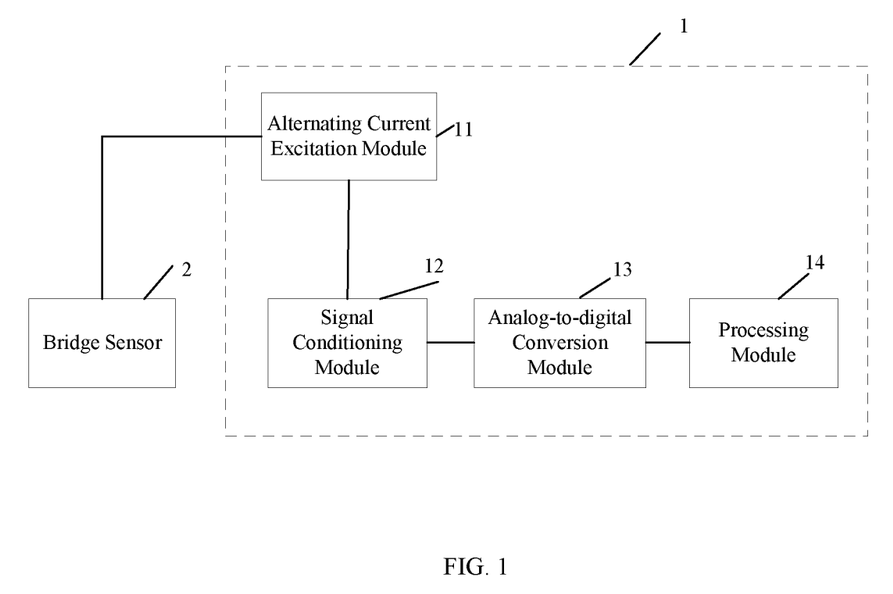
FIG. 1 is a schematic diagram of a detection circuit of a bridge sensor according to the present disclosure.

An embodiment of the present disclosure relates to a detection circuit of a bridge sensor. As shown in FIG. 1, a detection circuit 1 includes: an alternating current excitation module 11, and a signal conditioning module 12, an analog-to-digital conversion module 13 and a processing module 14 which are connected in sequence. The alternating current excitation module 11 is configured to apply an alternating current excitation signal to a bridge sensor 2. The signal conditioning module 12 and the analog-to-digital conversion module 13 are configured to sequentially process an output signal from the bridge sensor 2 to generate a processed output signal. The processing module 14 is configured to demodulate the processed output signal to generate a demodulated output signal and obtain detection information detected by the bridge sensor 2 according to the demodulated output signal. Herein, the bridge sensor 2 may be a sensor with different functions. The bridge sensor is, for example, a pressure sensor, and accordingly the detection information is a pressure value. Alternatively, the bridge sensor is, for example, a temperature sensor, and accordingly the detection information is a temperature value. The detection circuit 1 is a part of a touch chip, and the bridge sensor 2 and the touch chip may be located on a printed circuit board (PCB). The detection circuit 1 outputs the detection information to a host, and the host may be a CPU or other controller of an electronic device such as a mobile phone or a tablet.

Figure 2:
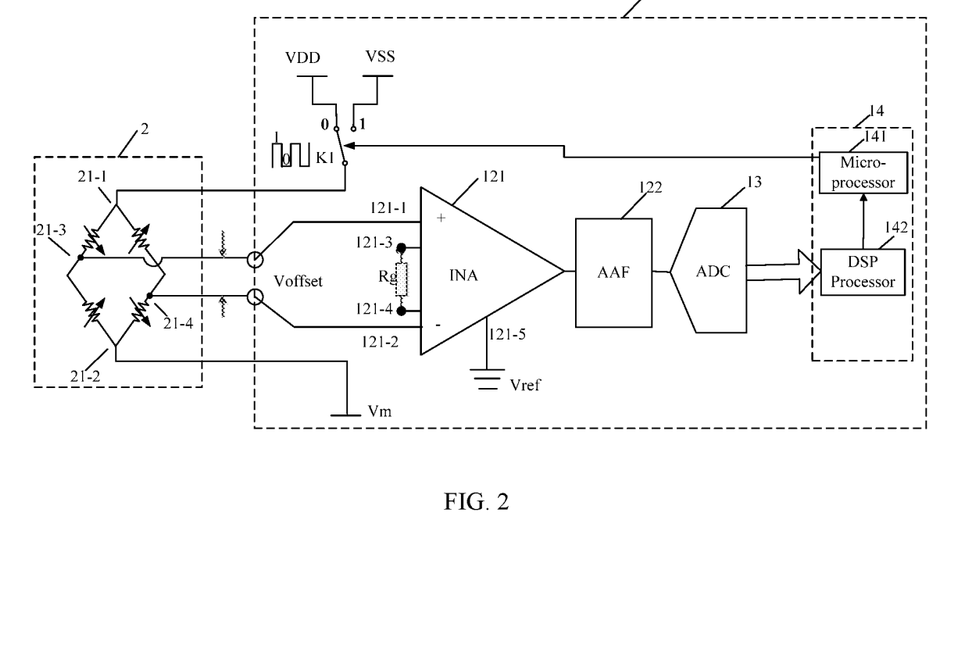
FIG. 2 is a specific circuit diagram of the detection circuit of the bridge sensor according to the present disclosure.

As shown in FIG. 2, the bridge sensor 2 in this embodiment includes four bridge arms, and each bridge arm may be a sensor composed of a resistance strain gauge. The bridge sensor 2 has two excitation applying terminals, which are a first excitation applying terminal 21-1 and a second excitation applying terminal 21-2. The bridge sensor 2 further has two output terminals, which are a first output terminal 21-3 and a second output terminal 21-4. The two output terminals of the bridge sensor 2 output a differential output voltage Voffset.

As shown in FIG. 2, the signal conditioning module 12 includes an instrumentation amplifier 121 and an anti-alias filter 122. In the figure, the instrumentation amplifier is denoted by INA and the anti-alias filter is denoted by AAF. The instrumentation amplifier 121 has two first input terminals 121-1 and 121-2, which are respectively connected to the two output terminals 21-3 and 21-4 of the bridge sensor 2. An output terminal of the instrumentation amplifier 121 is connected to an input terminal of the anti-alias filter 122, and an output terminal of the anti-alias filter 122 is connected to an input terminal of the analog-to-digital conversion module 13 which is represented by ADC in the figure. Herein, the instrumentation amplifier 121 further has two second input terminals 121-3 and 121-4, and a resistor Rg is connected between the two second input terminals 121-3 and 121-4. The resistor Rg may be arranged outside the instrumentation amplifier 121 or integrated in the instrumentation amplifier 121. The instrumentation amplifier 121 further has a third input terminal 121-5 configured to input a reference voltage Vref. The reference voltage Vref is a common mode voltage provided by a subsequent circuit such as the analog-to-digital conversion module 13 in this embodiment, that is, the reference voltage Vref is a common reference point for the instrumentation amplifier 121 and the analog-to-digital conversion module 13. Generally, for the instrumentation amplifier 121 powered by dual power supplies, the reference voltage Vref is zero, that is, the third input terminal 121-5 is grounded. For the instrumentation amplifier 121 powered by a single power supply, the reference voltage Vref is a half of the power supply voltage. The third input terminal 121-5 in FIG. 2 is grounded. It should be noted that FIG. 2 is only an example, and the specific implementation of the signal conditioning module 2 is not limited. Herein, the detection circuit 1 is a part of the touch chip, and the bridge sensor 2 and the touch chip may be located on the PCB. The detection circuit 1 outputs the detection information to a host, and the host may be a CPU or other controller of an electronic device such as a mobile phone or a tablet.

Figure 3:
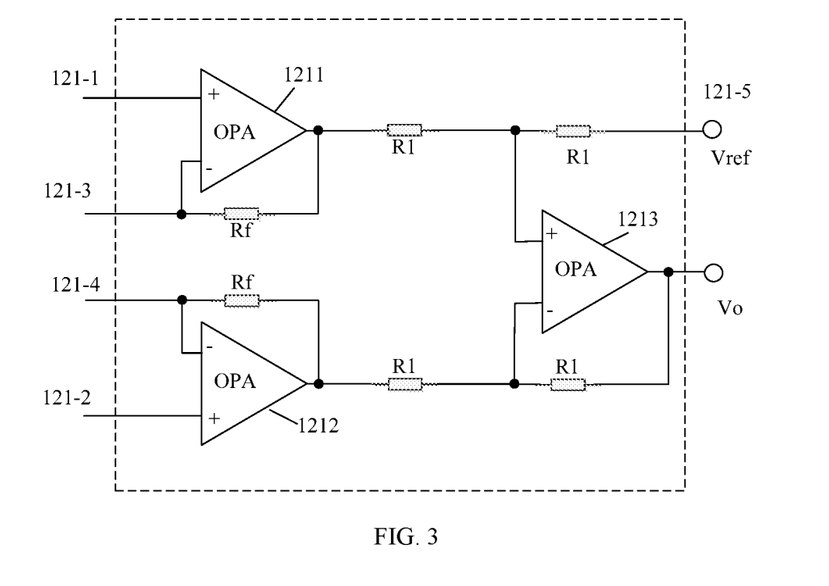
FIG. 3 is a specific circuit diagram of an instrumentation amplifier according to the present disclosure.

In an example, as shown in FIG. 3, the instrumentation amplifier 121 includes a first operational amplifier 1211, a second operational amplifier 1212, and a third operational amplifier 1213. An output terminal of the first operational amplifier 1211 is connected to a non-inverting input terminal of the third operational amplifier 1213, and an output terminal of the second operational amplifier 1212 is connected to an inverting input terminal of the third operational amplifier 1213. A non-inverting input terminal of the first operational amplifier 1211 and a non-inverting input terminal of the second operational amplifier 1212 serve as the two first input terminals 121-1 and 121-2 of the instrumentation amplifier 121, which are respectively connected to the two output terminals 21-3 and 21-4 of the bridge sensor 2. An inverting input terminal of the first operational amplifier 1211 and an inverting input terminal of the second operational amplifier 1212 serve as the two second input terminals 121-3 and 121-4 of the instrumentation amplifier 121. An output terminal of the third operational amplifier 1213 serves as the output terminal of the instrumentation amplifier 121. A resistor Rf is connected between the inverting input terminal and the output terminal of the first operational amplifier 1211. A resistor Rf is connected between the inverting input terminal and the output terminal of the second operational amplifier 1212. A resistor R1 is connected between the inverting input terminal and the output terminal of the third operational amplifier 1213. A resistor R1 is connected between the output terminal of the first operational amplifier 1211 and the non-inverting input terminal of the third operational amplifier 1213. A resistor R1 is connected between the output terminal of the second operational amplifier 1212 and the inverting input terminal of the third operational amplifier 1213. A resistor R1 is connected between the non-inverting input terminal of the third operational amplifier 1213 and the third input terminal 121-5.

The alternating current excitation module 11 is configured to generate the alternating current excitation signal. The alternating current excitation module 11 may be a signal generator for generating an alternating current voltage signal or an alternating current signal, or a hardware circuit for generating an alternating current voltage signal or an alternating current signal.

In this embodiment, the alternating current excitation module 11 is a hardware circuit. Referring to FIG. 2, the alternating current excitation module 11 includes a first direct current voltage source VDD, a second direct current voltage source VSS, and a first switch K1 configured to switch the first direct current voltage source VDD or the second direct current voltage source VSS to the first excitation applying terminal 21-1 of the bridge sensor 2. The voltages output from the first direct current voltage source VDD and the second direct current voltage source VSS are different. The first switch K1 is, for example, a single-pole double-throw switch.

In an example of FIG. 2, the second excitation applying terminal 21-2 is connected to a preset direct current voltage source Vm, where a magnitude of a voltage output from the preset direct current voltage source Vm is between magnitudes of voltages output from the first direct current voltage source VDD and the second direct current voltage source VSS. For example, the values of VDD, VSS and Vm may be: VDD=15 v, VSS=2 v and Vm=−5 v; or VDD=15 v, VSS=5 v, Vm=10 v; or VDD=5 v, VSS=−5 v, Vm=0 v, that is, it can be understood that the second excitation applying terminal 21-2 is grounded.

The processing module 14 is configured to control the first switch K1 to execute a switching operation, so that the first direct current voltage source VDD is connected to the first excitation applying terminal 21-1 through the first switch K1, or the second direct current voltage source VSS is connected to the first excitation applying terminal 21-1 through the first switch K1. In this embodiment, connecting the first direct current voltage source VDD to the first excitation applying terminal 21-1 is regarded as the detection circuit being in a first state. Connecting the second direct current voltage source VSS to the first excitation applying terminal 21-1 is regarded as the detection circuit being in a second state. Herein, a control signal, which is used by the processing module 14 to control the first switch K1 to realize the switching operation, may be periodically changed, and for example, the control signal is a square wave signal. In the condition that a difference between VDD and Vm is equal to a difference between Vm and VSS (for example, VDD=5 v, VSS=−5 v and Vm=0 v) and that the control signal of the processing module 14 for controlling the first switch K1 to realize the switching operation is a square wave signal, the alternating current excitation signal output from the alternating current excitation module 11 is also a square wave signal.

The differential output signal Voffset output by the bridge sensor 2 is an analog signal and includes two parts, one is a high-frequency alternating current excitation signal, and the other is a low-frequency direct current signal. The direct current signal includes superposition of the external force acting on the bridge sensor 2 and the whole circuit noise. Therefore, the alternating current excitation signal may be understood as a modulation signal of the direct current signal, which is configured to assist the transmission of the direct current signal. The frequency of the alternating current excitation signal may be selected as desired. The frequency of the alternating current excitation signal is determined by the frequency of the control signal of the processing module 14 controlling the first switch K1 to realize the switching operation.

The output signal Voffset of the bridge sensor 2 is amplified by the instrumentation amplifier 121, filtered by the anti-alias filter, and then converted to a digital output signal through a digital-to-analog conversion performed by the analog-to-digital conversion module 13. The processing module 14 is configured to demodulate the digital output signal to output a demodulated output signal and obtain the detection information detected by the bridge sensor according to the demodulated output signal. Herein, the processing module 14 demodulates the digital output signal based on a quadrature demodulation technology, which can reduce a calculation amount and lighten a burden of the processing module.

In the example of FIG. 2, the processing module 14 includes a DSP processor 142 and a microprocessor 141. The DSP processor 142 is configured to demodulate the digital output signal, and the microprocessor 141 is configured to obtain the detection information detected by the bridge sensor 2 according to the demodulated output signal. The detection information is, for example, a pressure value or a temperature value. The microprocessor 141 is further configured to control the switching operation of the first switch K1. However, the processing module 14 is not limited here. In other examples, the processing module 14 may include a microprocessor 141 which performs the demodulation function.

Compared with the existing technology, in some embodiments of the present disclosure, an alternating current excitation signal is applied to the bridge sensor 2. The useful information is only extracted near a frequency point of the alternating current signal during the demodulation of the alternating current signal, that is, a bandwidth of the signal involved during the demodulation is narrow, which thus can greatly suppress a white noise of a system, improve a signal-to-noise ratio of the system, and further improve a detection sensitivity of the bridge sensor. In addition, the demodulation of the alternating current excitation signal supports a frequency hopping, that is, the frequency of the alternating current excitation signal serving as the modulation signal may be selected as desired, which can avoid an interference frequency band of an external strong noise and greatly improve the reliability of the system in a harsh environment.

Figure 4:
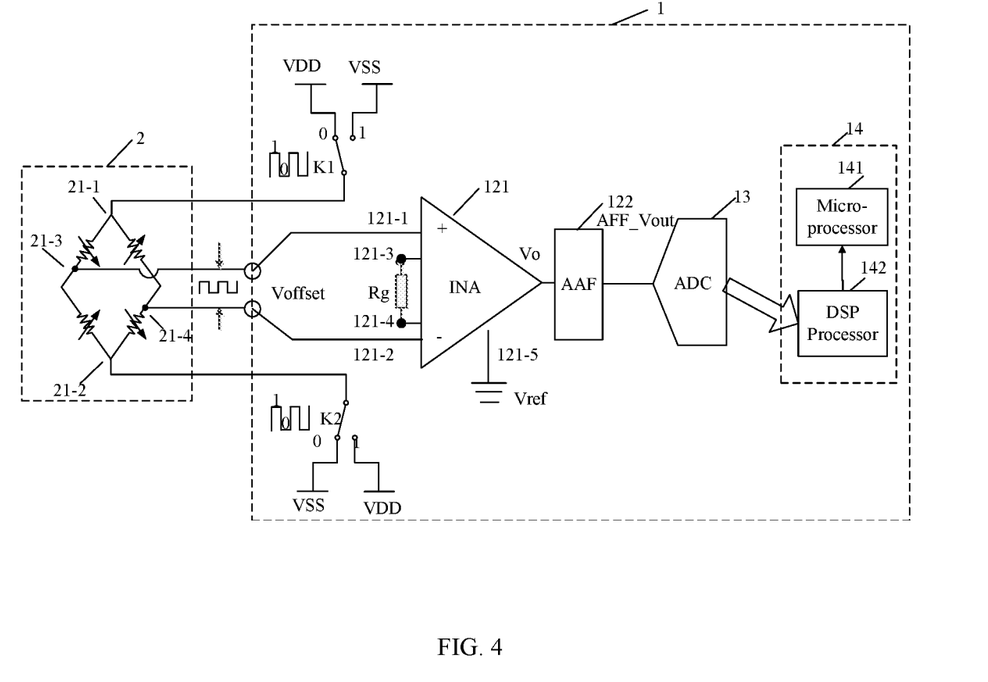
FIG. 4 is a specific circuit diagram of a detection circuit of a bridge sensor according to the present disclosure.

Another embodiment of the present disclosure relates to a detection circuit of a bridge sensor. This embodiment is different from the above-mentioned embodiments in that, as shown in FIG. 4, the alternating current excitation module 11 further includes a second switch K2. The second switch K2 is configured to switch the first direct current voltage source VDD or the second direct current voltage source VSS to the second excitation applying terminal 21-2 of the bridge sensor 2. The processing module 14 is configured to control the second switch K2 to execute a switching operation. In the first state, the processing module 14 further controls the second direct current voltage source VSS to connect to the second excitation applying terminal 21-2 through the second switch K2. In the second state, the processing module 14 further controls the first direct current voltage source VDD to connect to the second excitation applying terminal 21-1 through the second switch K2.

Specifically, the processing module 14 is configured to control the first switch K1 and the second switch K2 to execute the switching operation periodically. In a first half cycle, the processing module 14 controls the first switch K1 to operate so that the first direct current voltage source VDD is connected to the first excitation applying terminal 21-1 through the first switch K1, and the processing module 14 controls the second switch K2 to operate so that the second direct current voltage source VSS is connected to the second excitation applying terminal 21-2 through the second switch K2. In this way, the detection circuit 1 is in the first state. In a second half cycle, the processing module 14 controls the first switch K1 to operate so that the second direct current voltage source VSS is connected to the first excitation applying terminal 21-1 through the first switch K1, and the processing module 14 controls the second switch K2 to operate so that the first direct current voltage source VDD is connected to the second excitation applying terminal 21-2 through the second switch K2. In this way, the detection circuit 1 is in the second state.

In this embodiment, voltages output from the first direct current voltage source VDD and the second direct current voltage source VSS are equal in magnitude and opposite in direction. For example, VDD=5 v, VSS=-5 v.

The control signal, which may be used by the processing module 14 to control the first switch K1 and the second switch K2 to switch periodically, may be a square wave signal. In this case, the alternating current excitation signal output from the alternating current excitation module 11 is also a square wave signal. The detection circuit 1 is a part of a touch chip, and the bridge sensor 2 and the touch chip may be located on the PCB. The detection circuit 1 outputs the detection information to a host through the processing module 14. The host may be a CPU or other controller of an electronic device such as a mobile phone or a tablet.

In this embodiment, the direct current signals applied to the two excitation applying terminals are switched simultaneously to form an alternating current excitation signal. This simultaneous switching at the two excitation applying terminals can suppress a noise of the alternating current excitation module (such as a direct current power supply) itself and further improve a signal-to-noise ratio. In addition, voltages applied to the two excitation applying terminals at the same time are equal in magnitude and opposite in direction, which can maximize the effective voltage signal amount of the alternating current excitation signal.

An embodiment of the present disclosure relates to a detection circuit of a bridge sensor. This embodiment is an improvement on the basis of the mentioned-above embodiments. The improvement lies in that the processing module 14 processes the demodulated output signal Voffset based on a correlated double sampling technique to obtain the detection information detected by the bridge sensor 2.

In this embodiment, adopting the correlated double sampling technique can eliminate an offset in the circuit as much as possible, and the offset, for example, is an offset voltage drift, 1/f noise from itself and adverse parasitic thermocouple effect of the bridge sensor 2, and is an offset voltage drift and 1/f noise from itself of the instrumentation amplifier, thereby further reducing low-frequency noise of the circuit and improving a signal-to-noise ratio.

Figure 5:
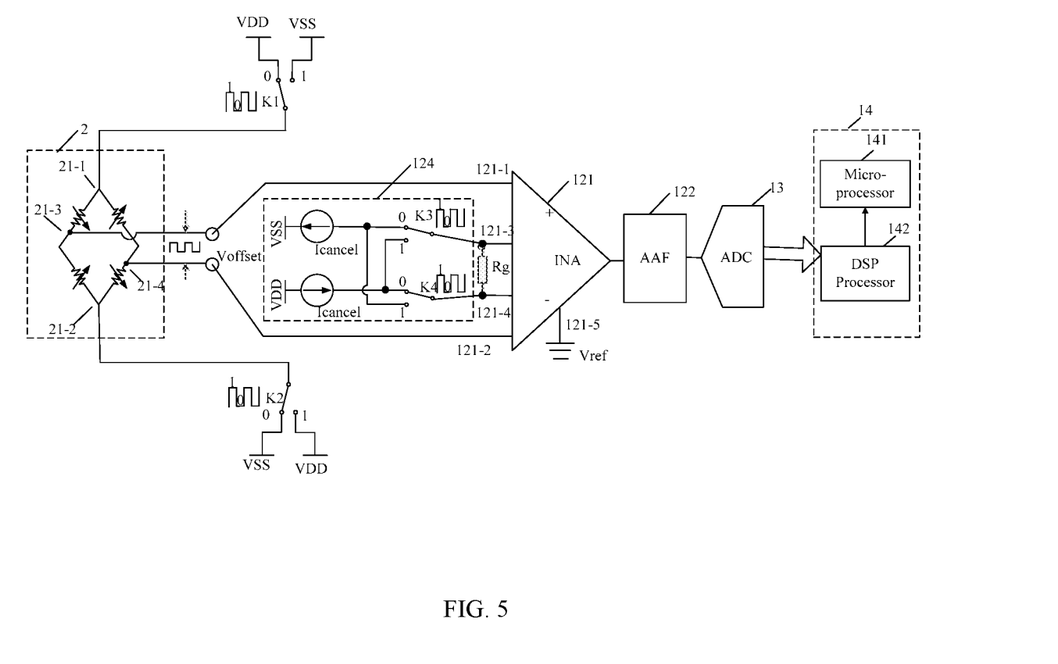
FIG. 5 is a schematic diagram of a signal conditioning module including a cancellation circuit according to the present disclosure.

An embodiment of the present disclosure relates to a detection circuit of a bridge sensor. This embodiment is an improvement on the basis of the mentioned-above embodiments. The improvement lies in that, as shown in FIG. 5, the signal conditioning module 12 further includes a cancellation circuit 124. The cancellation circuit 124 is connected to the second input terminals 121-3 and 121-4 of the instrumentation amplifier 121, and the cancellation circuit 124 is configured such that a voltage value output from the instrumentation amplifier 121 meets a preset requirement in the case when no external force acts on the bridge sensor 2.

In an example shown in FIG. 5, the cancellation circuit 124 includes a first direct current source, a second direct current source, a third switch K3 and a fourth switch K4. The third switch K3 is configured to switch one second input terminal 121-3 of the instrumentation amplifier 121 to the first direct current source or the second direct current source. The fourth switch K4 is configured to switch the other one second input terminal 121-4 of the instrumentation amplifier 121 to the first direct current source or the second direct current source. Herein, currents output from the first direct current source and the second direct current source are equal in magnitude and opposite in direction. In this embodiment, the current magnitude of the first direct current source and the current magnitude of the second direct current source are both represented by Icancel to reflect the same current magnitude of both the first direct current source and the second direct current source. In the figure, different directions of the first direct current source and the second direct current source are indicated by different arrows. In this embodiment, the first direct current voltage source VSS serves as a power supply of the first direct current source, and the second direct current voltage source VDD serves as a power supply of the second direct current source. However, it is not limited herein, as long as it may provide suitable power supply for the first direct current source and the second direct current source. It should be noted that after the magnitude and direction of the current of the first direct current source are determined, an appropriate power supply may be selected for it. The same is true for the second direct current source.

Figure 6:
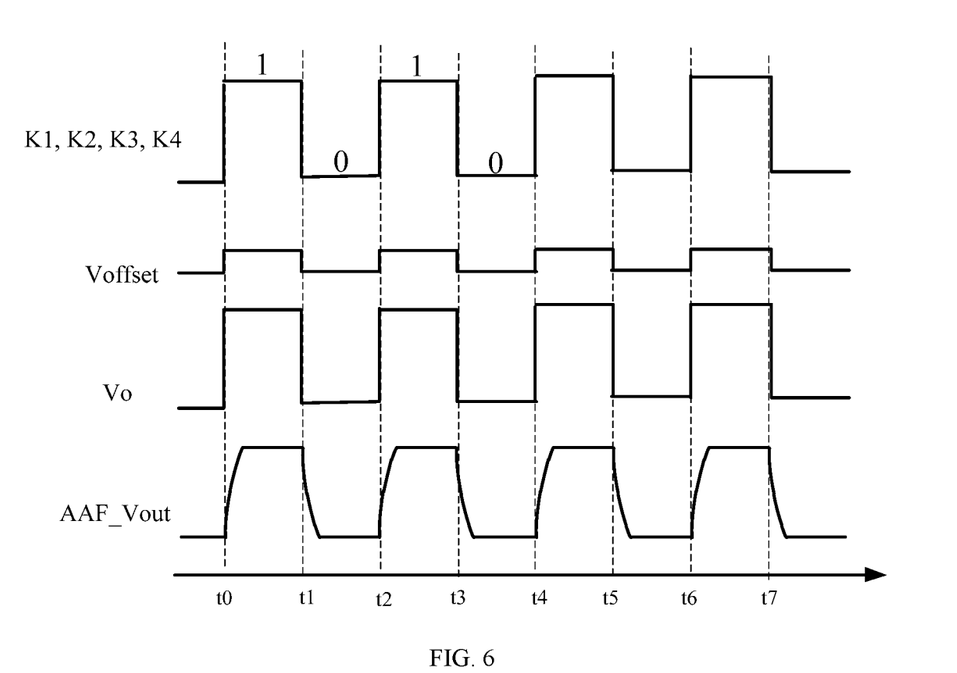
FIG. 6 is a schematic diagram of a timing waveform of a detection circuit according to the present disclosure.

The processing module 14 is configured to control the first switch K1, the second switch K2, the third switch K3 and the fourth switch K4 to periodically execute the switching operation. As shown in FIG. 6, a schematic diagram is provided for showing a timing waveform of the detection circuit in this embodiment. In FIG. 6, Vo represents an output voltage of the instrumentation amplifier 121, AFF_Vout represents an output voltage of the anti-alias filter 122, and t0-t7 represents different times.

The following is a description of the circuit principle of the cancellation circuit 124.

In a circuit solution of the present disclosure, the principle of the cancellation circuit 124 is described as follows.

Figure 7:
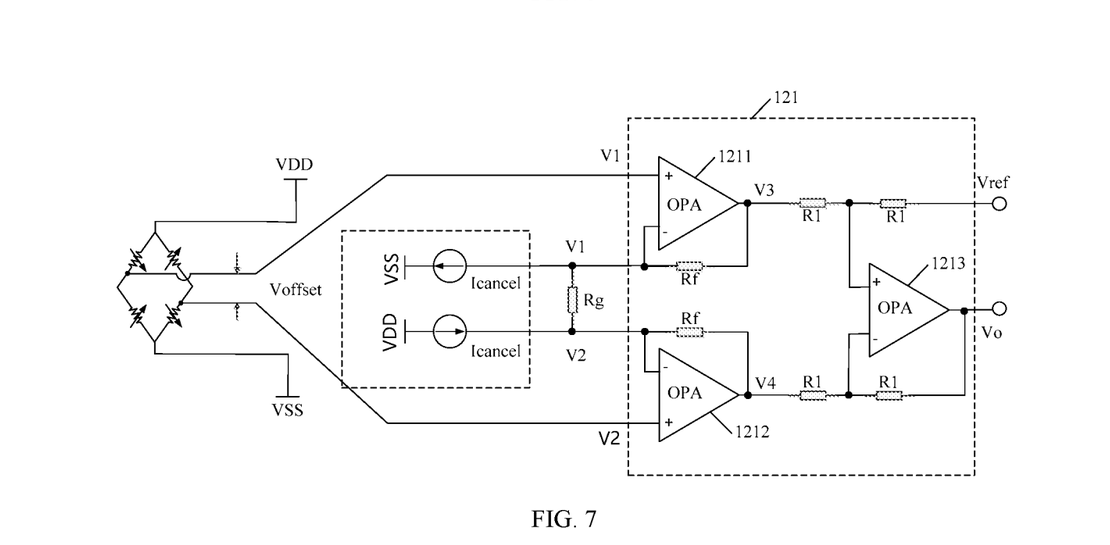
FIG. 7 is an equivalent circuit diagram of the detection circuit at a certain time according to the present disclosure.

For example, at time t1~t2, K1, K2, K3 and K4 are all set to a terminal "0", and at this time, the detection circuit may be simplified as shown in FIG. 7.

The output voltage Vo of the instrumentation amplifier 121 satisfies:

$Vo-Vref=V3-V4.$ while $V3=V1+[(V1-V2)/Rg+Icancel]*Rf$ $V4=V2-[(V1-V2)/Rg+Icancel]*Rf$ Therefore, the output voltage of the instrumentation amplifier 121 satisfies:

$Vo-Vref=(V1-V2)*(2*Rf/Rg+1)+ 2*Icancel*Rf=Voffset*(2*Rf/Rg+1)+ 2*Icancel*Rf;$

Adjusting to obtain Icancel=−Voffset*(2*Rf/Rg+1)/(2*Icancel), so that the output voltage Vo of the instrumentation amplifier 121 may satisfy: Vo−Vref=0.

Similarly, at the next moment, K1, K2, K3, and K4 are all set to a terminal "1". When Icancel=−Voffset*(2*Rf/Rg+1)/(2*Icancel), the output voltage Vo of the instrumentation amplifier 121 still satisfies: Vo−Vref=0. The output voltage Vo of the instrumentation amplifier 121 meets Vo−Vref=0 when K, K2, K3, and K4 are all set to the terminal "0" or the terminal "1", so it plays a role of cancellation.

If the four bridge arms of the bridge sensor 2 are completely matched, then in the case when no external force acts on the bridge sensor 2, a direct current part of the output signal Voffset of the bridge sensor 2 should be zero. However, due to the manufacturing technology, the four bridge arms in the bridge sensor 2 often may not be completely matched, so even in the case when no external force acts on the bridge sensor 2, a direct current part of the output voltage Voffset of the bridge sensor 2 is not zero, which is called a deviation of the output voltage Voffset. The cancellation circuit 124 is configured to cancel the deviation of the output voltage Voffset of the bridge sensor 2. Therefore, in the process of adjusting the cancellation circuit 124, the magnitude and direction of the current of the first direct current source and the second direct current source may be adjusted until the detected output signal of the instrumentation amplifier 121 meets the preset requirement. The preset requirement may be set as that a difference between the magnitude of the voltage output from the instrumentation amplifier 121 and a magnitude of a reference voltage Vref input to the instrumentation amplifier 121 is zero, wherein the reference voltage Vref is a common mode voltage provided by the analog-to-digital conversion module 13.

In this embodiment, the signal conditioning module 12 is newly added with the cancellation circuit 124, which may cancel the signal offset caused by incomplete matching of each bridge arm in the bridge sensor 2 as much as possible. Therefore, a requirement for matching degree of the bridge arms in the bridge sensor can be reduced, and a high-quality detection can be realized for an existing bridge sensor.

It should be noted that the specific implementation of the cancellation circuit provided in this embodiment is merely an example, and any circuit form, which is equivalently deformed and is capable of achieving the objective of the cancellation circuit, falls into the protection scope of the embodiment of the present disclosure. In addition, this embodiment may also be an improvement on the basis of the mentioned-above embodiments.

An embodiment of the present disclosure relates to a chip, including the detection circuit of the bridge sensor described in the mentioned-above embodiments.

A sixth embodiment of the present disclosure relates to a detection system, including a bridge sensor and the detection circuit of the bridge sensor described in the mentioned-above embodiments.

Those skilled in the art should appreciate that the aforementioned embodiments are specific examples for implementing the present disclosure. In practice, however, many changes can be made in forms and details without departing from the spirit and the scope of the present disclosure.

What is claimed is:

1. A detection circuit of a bridge sensor, comprising:
an alternating current excitation module, and
a signal conditioning module, an analog-to-digital conversion module and a processing module connected in sequence; wherein
the alternating current excitation module is configured to apply an alternating current excitation signal to the bridge sensor;
the signal conditioning module and the analog-to-digital conversion module are configured to sequentially process an output signal from the bridge sensor; and
the processing module is configured to demodulate a processed output signal, and obtain a detection information of the bridge sensor according to a demodulated output signal;

wherein the signal conditioning module comprises an instrumentation amplifier and an anti-alias filter;
a first input terminal of the instrumentation amplifier is connected to an output terminal of the bridge sensor, an output terminal of the instrumentation amplifier is connected to an input terminal of the anti-alias filter, and an output terminal of the anti-alias filter is connected to an input terminal of the analog-to-digital conversion module; and
the signal conditioning module further comprises a cancellation circuit;
wherein the instrumentation amplifier has two second input terminals, and the cancellation circuit comprises:
a first direct current source,
a second direct current source,
a third switch configured to switch the first direct current source or the second direct current source to one of the second input terminals, and
a fourth switch configured to switch the first direct current source or the second direct current source to the other one of the second input terminals;
wherein the processing module is further configured to control the third switch and the fourth switch to execute a switching operation; and
a current output from the first direct current source and a current output from the second direct current source are equal in magnitude and opposite in direction;
the cancellation circuit is configured such that a magnitude of a voltage output from the instrumentation amplifier meets a preset requirement in the case when no external force acts on the bridge sensor; and
wherein the preset requirement comprises: a difference between the magnitude of the voltage output from the instrumentation amplifier and a magnitude of a reference voltage input to the instrumentation amplifier is zero, and the reference voltage is a common mode voltage provided by the analog-to-digital conversion module.

2. The detection circuit of the bridge sensor according to claim 1, wherein the processing module is configured to process the demodulated output signal based on a correlated double sampling technique to obtain the detection information of the bridge sensor.

3. The detection circuit of the bridge sensor according to claim 1, wherein the alternating current excitation module comprises:
a first direct current voltage source,
a second direct current voltage source, and
a first switch configured to switch the first direct current voltage source or the second direct current voltage source to a first excitation applying terminal of the bridge sensor;
the processing module is configured to control the first switch to execute a switching operation;
wherein a voltage output from the first direct current voltage source is different from a voltage output from the second direct current voltage source.

4. The detection circuit of the bridge sensor according to claim 2, wherein the alternating current excitation module comprises:
a first direct current voltage source,
a second direct current voltage source, and
a first switch configured to switch the first direct current voltage source or the second direct current voltage source to a first excitation applying terminal of the bridge sensor;
the processing module is configured to control the first switch to execute a switching operation;
wherein a voltage output from the first direct current voltage source is different from a voltage output from the second direct current voltage source.

5. The detection circuit of the bridge sensor according to claim 3, wherein the alternating current excitation module further comprises a second switch configured to switch the first direct current voltage source or the second direct current voltage source to a second excitation applying terminal of the bridge sensor; the processing module is configured to control the second switch to execute a switching operation, such that:
in a first state, the processing module controls the first direct current voltage source to connect to the first excitation applying terminal through the first switch, and controls the second direct current voltage source to connect to the second excitation applying terminal through the second switch; and
in a second state, the processing module controls the second direct current voltage source to connect to the first excitation applying terminal through the first switch, and controls the first direct current voltage source to connect to the second excitation applying terminal through the second switch.

6. The detection circuit of the bridge sensor according to claim 4, wherein the alternating current excitation module further comprises a second switch configured to switch the first direct current voltage source or the second direct current voltage source to a second excitation applying terminal of the bridge sensor; the processing module is configured to control the second switch to execute a switching operation, such that:
in a first state, the processing module controls the first direct current voltage source to connect to the first excitation applying terminal through the first switch, and controls the second direct current voltage source to connect to the second excitation applying terminal through the second switch; and
in a second state, the processing module controls the second direct current voltage source to connect to the first excitation applying terminal through the first switch, and controls the first direct current voltage source to connect to the second excitation applying terminal through the second switch.

7. The detection circuit of the bridge sensor according to claim 5, wherein a voltage output from the first direct current voltage source and a voltage output from the second direct current voltage source are equal in magnitude and opposite in direction.

8. The detection circuit of the bridge sensor according to claim 1, wherein the alternating current excitation signal is a square wave signal.

9. The detection circuit of the bridge sensor according to claim 1, wherein the instrumentation amplifier comprises a first operational amplifier, a second operational amplifier and a third operational amplifier;
an output terminal of the first operational amplifier is connected to a non-inverting input terminal of the third operational amplifier, and an output terminal of the second operational amplifier is connected to an inverting input terminal of the third operational amplifier; and
a non-inverting input terminal of the first operational amplifier and a non-inverting input terminal of the second operational amplifier serve as two first input terminals of the instrumentation amplifier; an inverting input terminal of the first operational amplifier and an inverting input terminal of the second operational amplifier serve as the two second input terminals of the instrumentation amplifier; and an output terminal of the third operational amplifier serves as the output terminal of the instrumentation amplifier.

10. The detection circuit of the bridge sensor according to claim 1, wherein the processing module is configured to demodulate the processed output signal based on a quadrature demodulation method.

11. A chip, comprising a detection circuit of a bridge sensor, wherein, the detection circuit of the bridge sensor, comprises:
an alternating current excitation module, and
a signal conditioning module, an analog-to-digital conversion module and a processing module connected in sequence; wherein
the alternating current excitation module is configured to apply an alternating current excitation signal to the bridge sensor;
the signal conditioning module and the analog-to-digital conversion module are configured to sequentially process an output signal from the bridge sensor; and
the processing module is configured to demodulate a processed output signal, and obtain a detection information of the bridge sensor according to a demodulated output signal;
wherein the signal conditioning module comprises an instrumentation amplifier and an anti-alias filter;
a first input terminal of the instrumentation amplifier is connected to an output terminal of the bridge sensor, an output terminal of the instrumentation amplifier is connected to an input terminal of the anti-alias filter, and an output terminal of the anti-alias filter is connected to an input terminal of the analog-to-digital conversion module; and
the signal conditioning module further comprises a cancellation circuit;
wherein the instrumentation amplifier has two second input terminals, and the cancellation circuit comprises:
a first direct current source,
a second direct current source,
a third switch configured to switch the first direct current source or the second direct current source to one of the second input terminals, and
a fourth switch configured to switch the first direct current source or the second direct current source to the other one of the second input terminals;
wherein the processing module is further configured to control the third switch and the fourth switch to execute a switching operation; and
a current output from the first direct current source and a current output from the second direct current source are equal in magnitude and opposite in direction;
the cancellation circuit is configured such that a magnitude of a voltage output from the instrumentation amplifier meets a preset requirement in the case when no external force acts on the bridge sensor; and
wherein the preset requirement comprises: a difference between the magnitude of the voltage output from the instrumentation amplifier and a magnitude of a reference voltage input to the instrumentation amplifier is zero, and the reference voltage is a common mode voltage provided by the analog-to-digital conversion module.

12. The chip according to claim 11, wherein the processing module is configured to process the demodulated output signal based on a correlated double sampling technique to obtain the detection information of the bridge sensor.

13. The chip according to claim 11, wherein the alternating current excitation module comprises:
a first direct current voltage source,
a second direct current voltage source, and
a first switch configured to switch the first direct current voltage source or the second direct current voltage source to a first excitation applying terminal of the bridge sensor;
the processing module is configured to control the first switch to execute a switching operation;
wherein a voltage output from the first direct current voltage source is different from a voltage output from the second direct current voltage source.

14. A detection system, comprising a bridge sensor and a detection circuit of a bridge sensor, wherein, the detection circuit of the bridge sensor comprises:
an alternating current excitation module, and
a signal conditioning module, an analog-to-digital conversion module and a processing module connected in sequence; wherein
the alternating current excitation module is configured to apply an alternating current excitation signal to the bridge sensor;
the signal conditioning module and the analog-to-digital conversion module are configured to sequentially process an output signal from the bridge sensor; and
the processing module is configured to demodulate a processed output signal, and obtain a detection information of the bridge sensor according to a demodulated output signal;
wherein the signal conditioning module comprises an instrumentation amplifier and an anti-alias filter;
a first input terminal of the instrumentation amplifier is connected to an output terminal of the bridge sensor, an output terminal of the instrumentation amplifier is connected to an input terminal of the anti-alias filter, and an output terminal of the anti-alias filter is connected to an input terminal of the analog-to-digital conversion module; and
the signal conditioning module further comprises a cancellation circuit;
wherein the instrumentation amplifier has two second input terminals, and the cancellation circuit comprises:
a first direct current source,
a second direct current source,
a third switch configured to switch the first direct current source or the second direct current source to one of the second input terminals, and
a fourth switch configured to switch the first direct current source or the second direct current source to the other one of the second input terminals;
wherein the processing module is further configured to control the third switch and the fourth switch to execute a switching operation; and
a current output from the first direct current source and a current output from the second direct current source are equal in magnitude and opposite in direction;
the cancellation circuit is configured such that a magnitude of a voltage output from the instrumentation amplifier meets a preset requirement in the case when no external force acts on the bridge sensor; and
wherein the preset requirement comprises: a difference between the magnitude of the voltage output from the instrumentation amplifier and a magnitude of a reference voltage input to the instrumentation amplifier is zero, and the reference voltage is a common mode voltage provided by the analog-to-digital conversion module.

15. The detection system according to claim 14, wherein the processing module is configured to process the demodulated output signal based on a correlated double sampling technique to obtain the detection information of the bridge sensor.

16. The detection system according to claim 14, wherein the alternating current excitation module comprises:
- a first direct current voltage source,
- a second direct current voltage source, and
- a first switch configured to switch the first direct current voltage source or the second direct current voltage source to a first excitation applying terminal of the bridge sensor;
- the processing module is configured to control the first switch to execute a switching operation;
- wherein a voltage output from the first direct current voltage source is different from a voltage output from the second direct current voltage source.

\* \* \* \* \*